United States Patent [19]

Shields

[11] Patent Number: 5,164,683
[45] Date of Patent: Nov. 17, 1992

[54] RF AMPLIFIER ASSEMBLY
[75] Inventor: Michael R. Shields, Mesa, Ariz.
[73] Assignee: Motorola, Inc., Schaumburg, Ill.
[21] Appl. No.: 779,780
[22] Filed: Oct. 21, 1991
[51] Int. Cl.[5] ............................................. H03F 3/195
[52] U.S. Cl. ..................................... 330/307; 330/302
[58] Field of Search ...................... 330/65, 66, 67, 68, 330/277, 302, 307, 286, 287

[56] References Cited

U.S. PATENT DOCUMENTS 4,540,954  9/1985  Apel ..................................... 330/288
4,890,069 12/1989  Duffalo et al. ................. 330/302 X Primary Examiner—Steven Mottola
Attorney, Agent, or Firm—Joe E. Barbee

[57] ABSTRACT

A series resonant circuit (17, 16, 22, 21, 19) is employed to minimize the area utilized to form an RF amplifier (10). The series resonant circuit (17, 16, 22, 21, 19) utilizes a capacitor (21) along with inductors (17, 19, 22) that are formed by bonding wires (17, 19, 22) which interconnect the components of the amplifier (10). The series resonant circuit is tuned to the second harmonic of the fundamental frequency applied to the RF amplifier (10). The area consumed by the series resonant circuit (17, 16, 22, 21, 19) is small thereby minimizing the amplifier's size.

19 Claims, 1 Drawing Sheet 5,164,683

1

RF AMPLIFIER ASSEMBLY

BACKGROUND OF THE INVENTION

The present invention relates, in general, to amplifier circuits, and more particularly, to a novel high efficiency RF amplifier circuit.

In the past, the communications industry had utilized hybrid circuit manufacturing techniques to build radio frequency (RF) power amplifiers. One type of RF power amplifier generally operated within a specified range of an RF center frequency or fundamental frequency. Among other things, it was desirable for such an RF amplifier to have a high efficiency at the fundamental operating frequency. A technique commonly referred to as second-harmonic peaking was typically utilized to improve the efficiency of such an amplifier. Second-harmonic peaking frequently was implemented by connecting a quarter-wavelength transmission line in series between the amplifier's output stage and the amplifier's output terminal. The quarter-wavelength transmission line was a section of transmission line having a length that was approximately one-quarter the wavelength of the fundamental frequency. This quarter-wavelength transmission line produced a short circuit at all frequencies that were even harmonics of the fundamental frequency and an open circuit at all odd harmonics of the fundamental frequency. As a result, the amplifier's output voltage contained only the fundamental frequency and odd harmonics, while the output current contained only the fundamental frequency and even harmonics. Therefore, output power (current times voltage) was generated only at the fundamental frequency. The quarter-wavelength transmission line that was required to improve the efficiency of the amplifier had the disadvantage of consuming a large area thereby increasing the amplifier's size and its cost.

Accordingly, it is desirable to have an RF amplifier that has a high efficiency, that does not utilize a quarter-wavelength transmission line, that has a small size, and that has a low cost.

SUMMARY OF THE INVENTION

Briefly stated, the present invention includes coupling a series resonant circuit to the output of an RF amplifier. The series resonant circuit includes inductors that are formed by interconnects between the components of the amplifier along with a capacitor. The series resonant circuit can easily be coupled to the RF amplifier without requiring additional space on the amplifier.

DETAILED DESCRIPTION OF THE DRAWINGS

Figure 1:
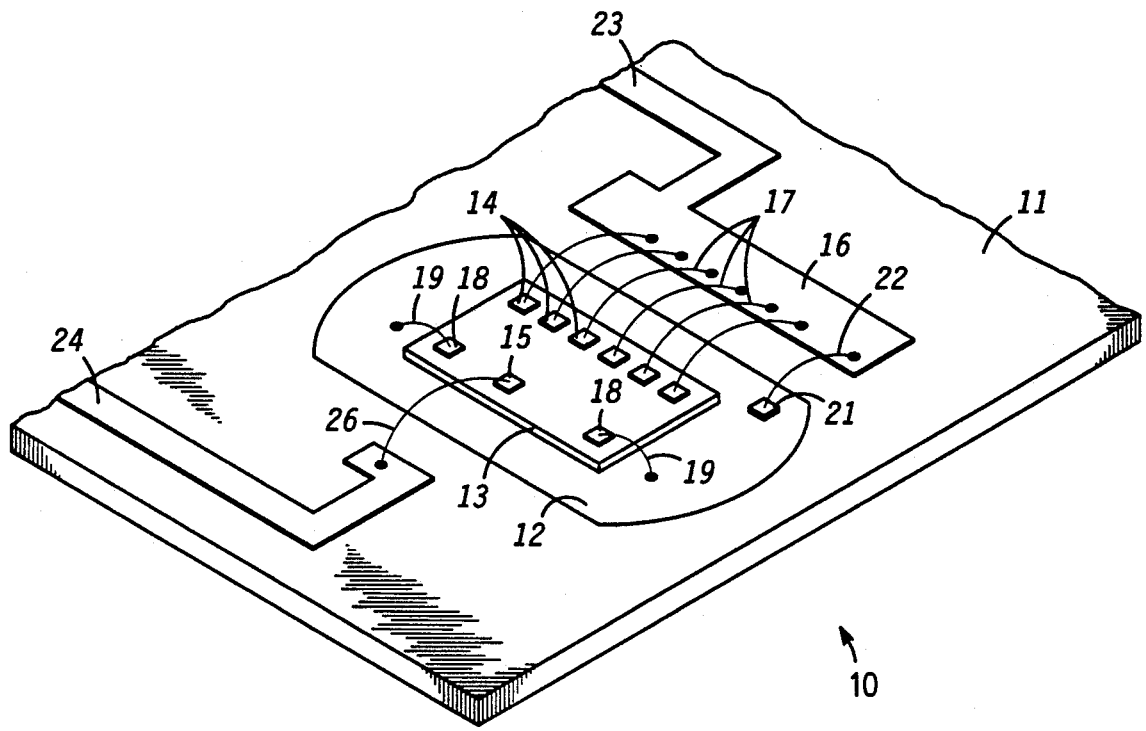
FIG. 1 is an isometric illustration of a portion of an RF power amplifier assembly in accordance with the present invention.

FIG. 1 illustrates a portion of the output stage of a high efficiency RF amplifier assembly 10. The components of amplifier 10 are mounted on a substrate 11 and interconnected by conductors that are on substrate 11. The output stage of amplifier 10 includes a semiconductor die or transistor 13 which is attached to a portion of substrate 11 that has been formed into an RF ground 12.

2

RF ground 12 functions as a low impedance termination for high frequency signals. In the preferred embodiment, RF ground 12 is a metal heatsink that is inserted into substrate 11 and assists in cooling transistor 13. Also in this preferred embodiment, transistor 13 is a gallium arsenide (GaAs) metal semiconductor field effect transistor (MESFET) power amplifier device. The source electrode of transistor 13 is connected to RF ground 12 by a plurality of source bonding wires 19 which have one end attached to a plurality of source bonding pads 18 and another end attached to RF ground 12. A common node 16, a conductor 24, and an output interconnect 23 are conductors that are formed on substrate 11 and are used to couple signals to and from transistor 13. High frequency signals that are to be amplified, are coupled from conductor 24 to a control electrode or gate 15 of transistor 13 via a bonding wire 26. Amplified output signals are coupled from the drain electrode of transistor 13 to output interconnect 23 by a plurality of bonding wires 17 which connect a plurality of drain bonding pads 14 to common node 16. Output interconnect 23 abuts common node 16 and conducts the amplified output signal from common node 16 to an output pin (not shown) of amplifier 10.

The amplified output signals of amplifier 10 generally contain odd and even harmonics of the signal which was applied to the gate of transistor 13. Amplifier 10 utilizes a series resonant circuit that forms a short circuit at the second harmonic in order to increase the efficiency of amplifier 10. As will be seen hereinafter, this series resonant circuit includes a capacitor 21 that is directly attached to RF ground 12, a bonding wire 22, plurality of bonding wires 19, and plurality of bonding wires 17. Because of the high frequency signals amplified by amplifier 10, bonding wires 17, 19, and 22 form inductors which, along with capacitor 21, implement the desired series resonant circuit. A surface of capacitor 21 is attached to RF ground 12 thereby forming a first terminal that electrically connects capacitor 21 to RF ground 12. A second terminal of capacitor 21 is connected to common node 16 by bonding wire 22. The length of bonding wire 22 and the height above RF ground 12 is selected to form an inductor having a predetermined value. In a similar manner, the length of bonding wires 17 and the height above RF ground 12 is selected to form another inductor having a predetermined value. In addition, source bonding wires 19 also have an inductance which is in series with the inductance formed by bonding wires 17. Since it is desirable to minimize the inductance of source bonding wires 19, the length and the height above RF ground 12 is minimized. In the preferred embodiment, the total series inductance of bonding wires 17, 19, and 22 is between approximately 3.7 and 4.0 nanohenrys. Of this total series inductance, bonding wire 22 provides an inductance of approximately 2.2 nanohenrys and source bonding wires 19 represent approximately 0.3 nanohenrys. Also in this preferred embodiment, capacitor 21 is a metal oxide semiconductor (MOS) capacitor having a value of approximately 2.3 picofarads.

Figure 2:
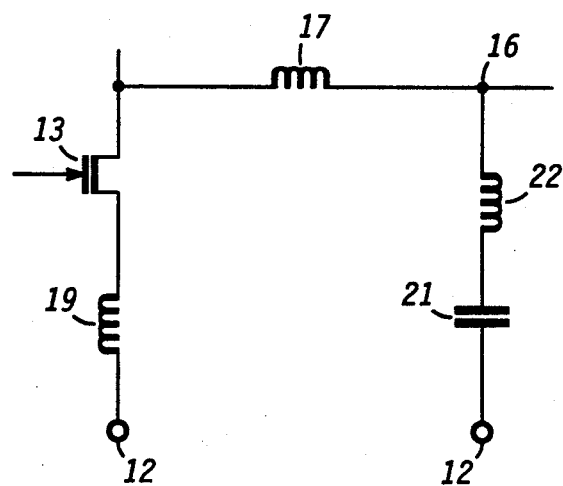
FIG. 2 is a schematic representation of a portion of the RF power amplifier assembly of FIG. 1 in accordance with the present invention.

FIG. 2 is a schematic illustration of an equivalent circuit formed by transistor 13 and the series resonant circuit. The elements of FIG. 2 that are the same as FIG. 1 have the same reference numerals. Transistor 13 is represented by a MESFET that has a drain electrode connected to a first terminal of an inductor 17 which represents the inductance formed by plurality of bonding wires 17 in FIG. 1. A second terminal of inductor 17 is connected to common node 16 of FIG. 1. Inductor 22, representing the inductance of bonding wire 22 in FIG. 1, has a first terminal connected to common node 16 and a second terminal connected to a first terminal of capacitor 21. Capacitor 21 has a second terminal connected to a common connection point 12 which represents RF ground 12 of FIG. 1. The inductance of bonding wires 19 from FIG. 1, is represented by an inductor 19 which has a first terminal connected to a source electrode of transistor 13 and a second terminal connected to common connection point 12.

The series resonant circuit has a resonant frequency that is equal to the second harmonic of the fundamental frequency which is applied to the control electrode of transistor 13. At the resonant frequency, the series resonant circuit represents a short circuit. Consequently, the output voltage is zero at the resonant frequency and no power is developed at this frequency. In the preferred embodiment, transistor 13 has limited gain at frequencies in excess of the second harmonic. Therefore, the power in frequencies greater than the second harmonic is, for all practical purposes, approximately zero.

An example of a previous RF amplifier circuit utilizing a quarter-wavelength transmission line can be compared to the series resonant circuit utilized for amplifier 10 of FIG. 1. At a fundamental frequency of approximately 800 MHz, a previous quarter-wavelength amplifier implementation requires a transmission line that is approximately 3.8 centimeters in length. In contrast, utilizing the series resonant circuit shown in FIG. 1 does not require any extra space on substrate 11. Capacitor 21 is mounted to RF ground 12 which is required to improve cooling as previously discussed in FIG. 1. Consequently, no extra area was required to implement the series resonant circuit. This is a significant saving in area which results in minimizing the cost of amplifier 10 of FIG. 1.

While the invention is described with specific preferred embodiments, it is evident that many alternatives and variations will be apparent to those skilled in the art. Consequently, it should be noted that transistor 13 could be a variety of other types of semiconductor devices including, but not limited to, silicon bipolar transistors, heterojunction bipolar transistors, and heterojunction field effect transistors. In addition, the invention has been described for a particular physical placement of components that utilizes wirebonds although the method is directly applicable to other configurations and bonding methods, including TAB bonding, and other component values.

By now it should be appreciated that there has been provided a novel way to fabricate a small, low cost amplifier assembly. The use of a series resonant circuit that is formed from a capacitor and wiring inductances provides a novel solution to the problem of minimizing the area consumed by an RF amplifier. The series resonant circuit is small and does not require additional space thereby reducing the amplifier's size and minimizing the amplifier's cost. The small size allows the amplifier to be used in small, hand held equipment, and reduces the space required for such equipment.

I claim:

1. An RF amplifier assembly comprising:
   a substrate having a radio frequency (RF) ground;
   a semiconductor die having a surface attached to the RF ground, and also having a control electrode, a first current carrying electrode, and a second current carrying electrode;
   a capacitor having a first surface mounted on the RF ground wherein the first surface of the capacitor electrically couples the capacitor to the RF ground;
   a common node on the substrate;
   a capacitor bonding wire having a first end connected to a second surface of the capacitor, and a second end connected to the common node;
   a first bonding wire having a first end attached to the first current carrying electrode of the semiconductor die, and a second end attached to the RF ground wherein the first bonding wire forms an inductor having a predetermined inductance which inductively couples the RF ground to the first current carrying electrode of the semiconductor die; and
   a plurality of second bonding wires which form an inductor having a predetermined inductance that inductively couples the second current carrying electrode of the semiconductor die to the common node by having a first end of the plurality of second bonding wires attached to the second current carrying electrode of the semiconductor die and a second end of the plurality of second bonding wires attached to the common node wherein the capacitor, the capacitor bonding wire, the first bonding wire, and the plurality of second bonding wires form a series resonant circuit that has a resonant frequency which is approximately twice a frequency that is applied to the control electrode of the semiconductor die.

2. The amplifier of claim 1 wherein the semiconductor die is a gallium arsenide metal semiconductor field effect transistor (MESFET) amplifier.

3. The amplifier of claim 1 wherein the capacitor is a metal oxide semiconductor (MOS) capacitor.

4. The amplifier of claim 3 wherein the MOS capacitor has a value of approximately 2.3 picofarads.

5. The amplifier of claim 1 wherein the capacitor bonding wire, the first bonding wire, and the plurality of second bonding wires have a total combined series inductance that is between approximately 3.7 and 4.0 nanohenrys.

6. A method of forming a small RF amplifier comprising:
   providing a substrate having a semiconductor die attached to a portion of the substrate which forms a radio frequency (RF) ground, the substrate also having a common node;
   coupling a first inductor in series between a first current carrying electrode of the semiconductor die and the common node;
   coupling a second inductor in series with a capacitor wherein the second inductor and the capacitor are in series between the common node and the radio frequency (RF) ground; and
   coupling a third inductor between a second current carrying electrode of the semiconductor die and the radio frequency (RF) ground wherein the capacitor, the first inductor, the second inductor, and the third inductor form a series resonant circuit having a resonant frequency approximately twice a frequency applied to a control electrode of the semiconductor die.

7. The method of claim 6 wherein coupling the first inductor in series between the first current carrying electrode of the semiconductor die and the common node includes forming a plurality of bonding wires for connecting the first current carrying electrode of the semiconductor die to the common node wherein the plurality of bonding wires form the first inductor.

8. The method of claim 7 wherein forming the plurality of bonding wires includes forming the plurality of bonding wires having a predetermined length and a predetermined height above the radio frequency (RF) ground for the purpose of forming a predetermined inductance.

9. The method of claim 6 wherein coupling the second inductor in series with the capacitor includes attaching a first surface of the capacitor that is a first terminal of the capacitor to the radio frequency (RF) ground, and attaching a bonding wire having a predetermined inductance between a second surface of the capacitor and the common node wherein the bonding wire forms the second inductor.

10. The method of claim 9 wherein having a predetermined inductance includes having an inductance of approximately 2.2 nanohenrys.

11. The method of claim 6 wherein coupling the third inductor between the second current carrying electrode of the semiconductor die and the radio frequency (RF) ground includes forming a bonding wire connecting the second current carrying electrode of the semiconductor die to the radio frequency (RF) ground wherein the bonding wire has a predetermined length and a predetermined height above the radio frequency (RF) ground for the purpose of forming a predetermined inductance.

12. The method of claim 11 wherein forming the predetermined inductance includes forming an inductance of approximately 0.3 nanohenrys.

13. The method of claim 6 wherein coupling the second inductor in series with the capacitor includes coupling the second inductor in series with a metal oxide semiconductor (MOS) capacitor.

14. A method of forming an RF amplifier comprising:

inductively coupling a first current carrying electrode of a semiconductor die to a common node by using a first predetermined inductance;

inductively coupling a first terminal of a capacitor to the common node by using a second predetermined inductance; and inductively coupling a second terminal of the capacitor to a second current carrying electrode of the semiconductor die by using a third predetermined inductance.

15. The method of claim 14 wherein inductively coupling the first current carrying electrode of the semiconductor die to the common node includes coupling the first current carrying electrode of the semiconductor die to the common node by using a bonding wire having the first predetermined inductance.

16. The method of claim 14 wherein inductively coupling the first terminal of the capacitor to the common node includes connecting the first terminal of the capacitor to the common node by using a bonding wire having the second predetermined inductance.

17. The method of claim 14 wherein inductively coupling the first terminal of the capacitor to the common node includes inductively coupling the first terminal of an MOS capacitor to the common node.

18. The method of claim 14 wherein inductively coupling the first current carrying electrode of the semiconductor die includes inductively coupling the first current carrying electrode of the semiconductor die that is attached to an RF ground that is on a substrate.

19. The method of claim 14 wherein inductively coupling the second terminal of the capacitor to the second current carrying electrode of the semiconductor die by using the third predetermined inductance includes attaching a surface of the capacitor to an RF ground that is on a substrate, and coupling the third predetermined inductance from the RF ground to the second current carrying electrode of the semiconductor die.

* * * * *